(12) United States Patent
Gudesen

(10) Patent No.: US 6,775,173 B2
(45) Date of Patent: Aug. 10, 2004

(54) MATRIX-ADDRESSABLE APPARATUS WITH ONE OR MORE MEMORY DEVICES

(76) Inventor: Hans Gude Gudesen, Hans Petters vei 7, N-1639 Gamle Fredrikstad (NO), 1639

( * ) Notice: Subject to any disclaimer, the term of this patent is extended or adjusted under 35 U.S.C. 154(b) by 0 days.

(21) Appl. No.: 10/293,341

(22) Filed: Nov. 14, 2002

(65) Prior Publication Data

US 2003/0099126 A1 May 29, 2003

Related U.S. Application Data

(60) Provisional application No. 60/333,749, filed on Nov. 29, 2001.

(30) Foreign Application Priority Data

Nov. 28, 2001 (NO) .......................................... 2001 5815

(51) Int. Cl.[7] .............................................. G11C 11/24
(52) U.S. Cl. ...................................... 365/145; 365/171
(58) Field of Search ................................. 365/171, 145, 365/63, 51, 130

(56) References Cited

U.S. PATENT DOCUMENTS

| 5,745,336 A | * | 4/1998 | Saito et al. .............. 361/321.5 |
| 6,172,898 B1 | | 1/2001 | Kajiyama .................... 365/149 |

FOREIGN PATENT DOCUMENTS

| EP | 0 03 486 | 3/1983 |
| FR | 2.036.061 | 12/1970 |
| GB | 1 293 897 | 10/1972 |
| GB | 1 310 832 | 3/1973 |
| NO | 20015509 | 11/2001 |

* cited by examiner

Primary Examiner—Vu A. Le
(74) Attorney, Agent, or Firm—Jacobson Holman PLLC

(57) ABSTRACT

In a matrix-addressable apparatus comprising one or more memory devices with multidirectionally switchable memory cells arranged in a passive matrix-addressable array, the memory cells comprised a memory medium in the form of a ferroelectric or electret, thin-film memory material capable of being polarized by an applied electric field and exhibiting hysteretic, and preferable the memory material is a polymer or copolymer. A memory device in the apparatus comprised at least a first and second electrode means such that the electrodes of the second electrode means are provided in recesses in the electrodes of the first electrode means and oriented orthogonally thereto, the recesses extending only half-way through the electrodes of the first electrode means. The electrodes of the second electrode means are provided in the recesses surrounded by memory material which also contacts the crossing electrodes of the first electrode means whereby a memory cell is defined in the crossing between electrodes of the first and second electrode means respectively and formed by a memory material surrounding the electrodes of the second means on at least three sides thereof, thus providing at least three switching directions in the memory cell at different locations thereof.

8 Claims, 4 Drawing Sheets

Figure 1:
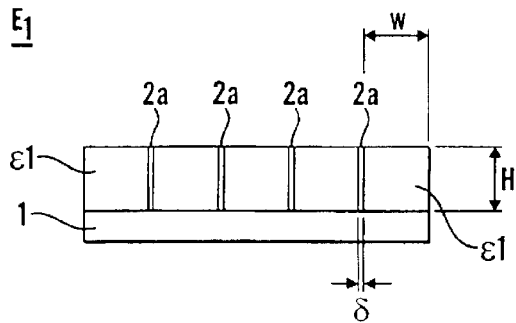

"LATERAL"
SWITCHING
DIRECTION

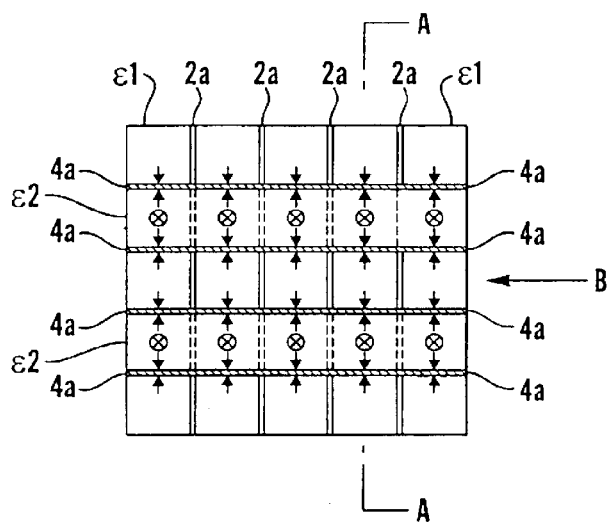
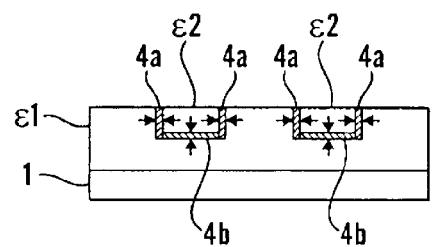
Fig.7a
Fig.7b
"LATERAL" SWITCHING DIRECTION
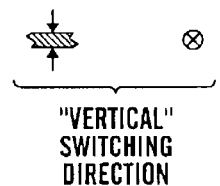
"VERTICAL" SWITCHING DIRECTION
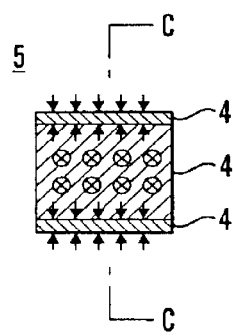
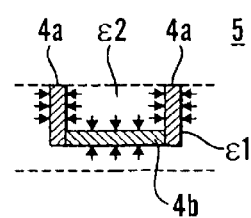
Fig.8a
Fig.8b

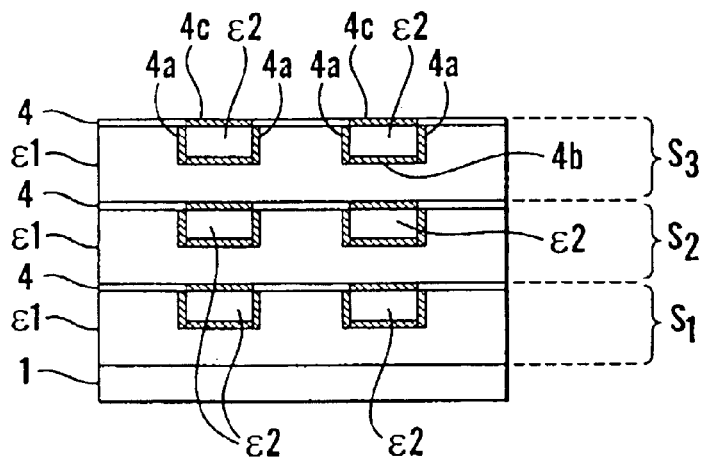
Fig. 12a
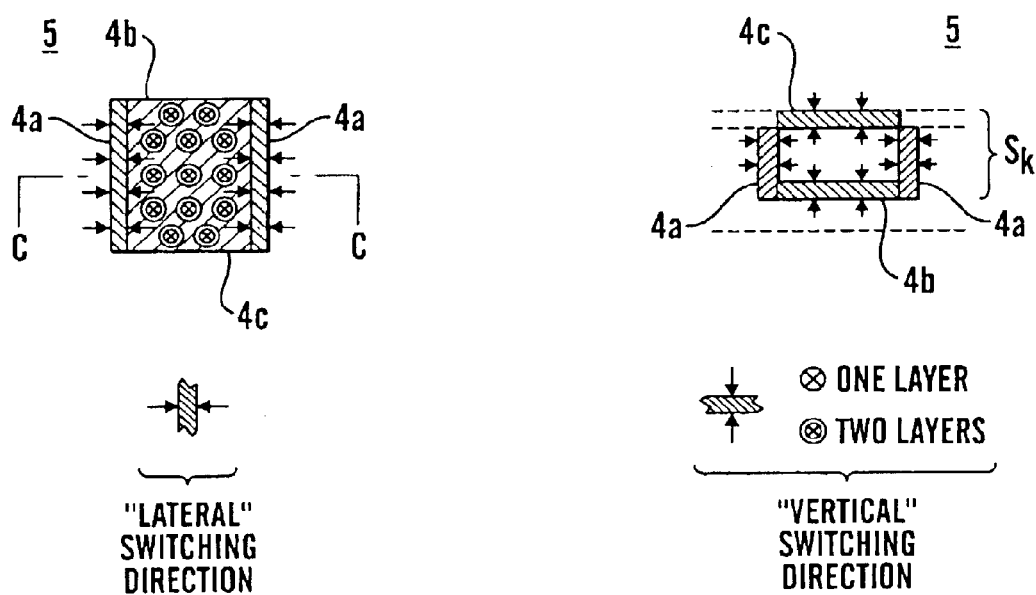
Fig. 12b
Fig. 12c

MATRIX-ADDRESSABLE APPARATUS WITH ONE OR MORE MEMORY DEVICES

This is a complete application claiming benefit of provisional No. 60/333,749 filed Nov. 29, 2001.

The present invention concerns matrix-addressable apparatus comprising one or more memory devices with multi-directionally switchable memory cells arranged in a passive matrix-addressable array, wherein the memory cells comprises a memory medium in the form of a ferroelectric or electret thin-film memory material capable of being polarized by an applied electric field and exhibiting hysteresis, wherein at least one memory device comprises at least two and not more than three electrode means, wherein the first electrode means of said at least one memory device being either the only memory device of the apparatus or the first of two or more memory devices therein, is provided on an insulating substrate.

From an architectural standpoint the passive matrix approach of memories with a polymer memory in sandwich between the electrode layers is more attractive than the 1T/1C approach of state of the art silicon memory architectures, partly because it represent denser lateral storage (4f2 vs. 6f2 and larger), but even more because it allows stacking of successive memory layers, e.g. controlled from joint substrate circuitry. However, it is still a fact that even the 4f2 design only renders a 25% areal fill factor. With 50 to 100% fill factor the need for more than one memory layer would be equally reduced, as will production complexity, yield and—cost. Also, using only one or two memory layers would reduce the effect of polymer postprocessing correspondingly and hence prevent the negative performance effects from such procedures.

The traditional approach to increase cell density is by reducing cell area. However, the smaller the cell footprint, the smaller the signal (and the lower the SNR), and the more sensitive and hence complex and real estate demanding the read-out circuitry (dominated by sense amps) will have to be. In fact it is considered extremely challenging to build crosspoint matrix systems of any kind with smaller line pitch than 0.30 $\mu$m–0.40 $\mu$m (cell size, 0.09 $\mu m^2$).

A concern related to multi-layer stacking is planarization. Building successive layers on preceding ones gradually produces a "curvy/bumpy" topography which creates substantial problems in regard of lithography control and hence the ability to address and read out from cells (e.g. sense amps are designed relative to an expected cell area, if this, through non-uniform lithography, varies beyond certain limits, the signal cannot be read out reliably/the difference between ones and zeros more difficult to determine).

The architecture also defines how many mask steps are minimum required, the fewer the less costly the manufacturing. Reducing number of mask steps per bit is very important, the present polymer matrix requires 19 more mask steps than competing flash memories for a typical device having 8 memory layers, which means almost twice the costs to process such a wafer compared to state of the art CMOS processes for e.g. flash memories.

In a polymer crosspoint matrix memory using a vertical switching field, the morphology of the spinned polymer films largely decides the usability in memory applications. It is particularly challenging to maintain an optimal morphology in regard of ferroelectric properties when film thickness shrinks below 100 nm. At such thicknesses the films are much more sensitive to type of solvents used, spin and baking conditions, type and effect of interfacial/barrier layers, etc. Increasingly thinner films are desirable in order to reduce switching voltage, e.g. films need to be thinner than 30 nm in order to achieve switching voltages lower than 5V. Lower voltage levels are required in order to use progressively denser lithography and be compatible with related design rules, which also allows reduced power consumption. Low voltage is furthermore very attractive in polymer memories, since it allows more, eventually all, circuitry to be built underneath the passive memory matrix, which again reduces effective cell footprint by reducing overhead footprint, possibly to zero, making vias, connections, etc. easier to design and implement.

However, to make such thin films with acceptable uniformity/morphology and no shorts, is very demanding over large areas (like a wafer), also because important ferroelectric properties, like crystallinity, tend to detonate with thinner films, while leakage and sneak currents represent an increasing problem. This again seriously affects the memory properties, e.g. the level of switchable and remnant polarization (important for distinguishing between ones and zeros), switching endurance and switching speed. Especially high temperature performance (e.g. >60° C.) seems to be tremendously reduced.

But even thicker memory films experience a range of problems, similar, if not so expressed, to those of thinner films. The preferred and established film application approach is spin-coating, using an appropriate solvent. The choice of solvent, spin conditions, possible solvent residues, baking conditions relative to solvent choice, etc., represent a great challenge regarding obtaining the correct combination of parameters, a challenge which is even much greater when thin films are concerned. Solvents are necessary to use in order to obtain thin, uniform films on wafer substrates.

Due to the switching voltage dependence of film thickness (see below), with reduced film uniformity, the coercive field will vary accordingly, which will create problems during operation if the variations are larger than the designed maximum swing in voltage. On the other hand, the larger the swing (designed), the more complex the circuitry will need to be to handle it, with added costs in regard of real estate efficiency/production complexity/device cost.

Probably an even greater morphology concern is the fact that the polymer is exposed to substantial postprocessing, e.g. deposition of top electrodes, interfacial layers, vias connections, etc. in multi-layered memory stacks, and this represents a potentially severe negative impact on the polymer, which are very difficult to control properly, especially in a commercial manufacturing process.

The use of polymer and especially the fact that the electrodes rest directly onto this material which has a melting temp of approximately 150° C., result in problems when packaging is concerned. In a typical soldering process, temperature can reach as high as 210° C. (for limited periods), which cause problems for the architecture, since the polymer electrodes start to melt and float such that the electrode/polymer film interface may be seriously damaged.

The object of the present invention is thus to obviate the above-mentioned disadvantages and problems with prior art matrix-addressable memory devices with particularly polymer memory materials and as used in a matrix-addressable data storage device.

The object of the invention as well as further features and advantages are realized with a matrix-addressable apparatus according to the present invention which is characterized in that the first electrode means comprises parallel strip-like electrodes of width w and height h spaced apart and mutually electrically insulated by a portion of insulating thin-film material provided between the electrodes and covering the side edges thereof in a layer of thickness δ, said thickness δ being small fraction of the electrode width w, that the electrodes have a high aspect ratio h/w, that the first electrode means comprises a plurality of parallel recesses in the top surface thereof and oriented perpendicularly to the longitudinal axis of the electrodes with a width about equal to the electrode width w and extending downwards from the top surface of the electrodes to a distance h about one half of the height H of the latter, said recesses being mutually spaced apart by a distance approximately equal to the width w of the electrodes, that at least the side walls of said recesses are covered by a thin film of the memory material and the bottom surface thereof with the insulating thin film which optionally also can be formed by the memory material, and that electrodes of the second electrode set are provided in the recesses contacting and interfacing the thin-film memory material thereof, such that the memory material provided in the recesses forms the memory cell of the memory device, a single memory cell in each case being defined in the volume of the memory material located between an electrode of the first electrode means and an electrode of the second electrode means at the crossing thereof, whereby a memory cell can be polarized and switched into lateral directions perpendicular to the side walls of the recess and in a third direction perpendicular to the bottom surface of the recess, provided said bottom surface also is covered by the memory material.

In an advantageous embodiment of the apparatus according to the present invention, wherein the at least one memory device comprises a third electrode means an insulating thin film is provided over the top surfaces of the electrodes of the first and second electrode means respectively, said insulating thin film in at least a portion covering the top surfaces of the electrodes of the second electrode means being formed by the memory material, the electrodes of the third electrode means are provided contacting and interfacing the insulating thin film in an arrangement similar to that of the first electrode means and oriented in the same direction as this and perpendicularly to the electrodes of the second electrode means, such that an electrode of the third electrode means registers with the corresponding electrode of the first electrode means, whereby each memory cell is defined by a thin film of a memory material covering an electrode of the second electrode means at the crossing of the latter between an electrode of the first and third electrode means respectively, such that a memory cell can be polarized and switched in a fourth direction perpendicular to the top surface of an electrode of the second electrode means.

In a variant of this embodiment wherein two or more memory devices are provided in a vertical stack, the top surfaces of the electrodes of the third electrode means are covered by an insulating backplane, and each memory device are provided stacked one above each other separated by the insulating backplanes, whereby the apparatus is implemented as a volumetric data storage apparatus.

Where the apparatus according to the invention is realized with two or more memory devices provided in a vertical stack, the first electrode means and the second electrode means of a memory device are each provided in registering relationship with respectively the corresponding electrode means in any other memory device in the stack, each memory device in the stack are separated from any adjacent neighbouring memory device by insulating thin film applied over the top surfaces of the electrodes, said insulating thin film at least in the portions where electrodes of the second electrode means cross the electrodes of the first electrode means in the adjacent neighbouring memory device being formed by the memory material which in these portions can be polarized or switched in a fourth direction perpendicular to the top surface of the electrodes of the second electrode means by applying an electric field between these electrodes and crossing electrodes of the first electrode means of an adjacent neighbouring memory device, and a memory cell is defined in the memory material surrounding an electrode of the second electrode means at the crossing between the latter and the electrodes of the first electrode means in respectively the actual memory device and an adjacent neighbouring memory device in the stack, whereby the apparatus is implemented as a volumetric data storage apparatus with the first electrode means from a second memory device in the stack onward functions as a third electrode means of the underlying neighbouring memory device.

In the apparatus according to the invention the insulating thin-film material preferably can be a ferroelectric or electret material, and the memory material can likewise be a polymer or copolymer material. The insulating thin-film material and the memory material can be the same material and the memory material can then preferably be a polymer or a copolymer material.

Further features and advantages of the apparatus according to the invention shall be apparent from the appended dependent claims.

Figure 2:
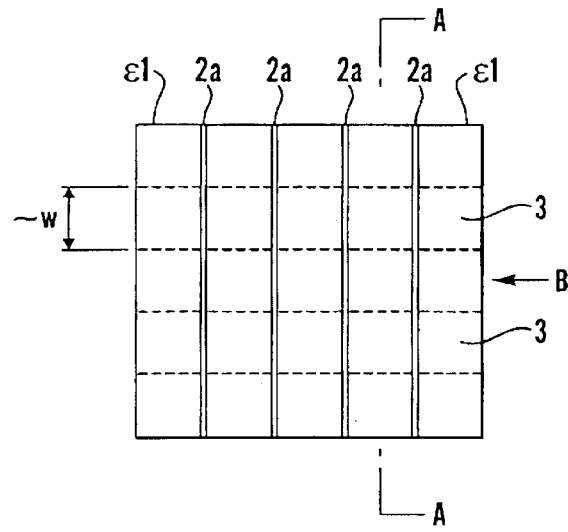
Figure 3:
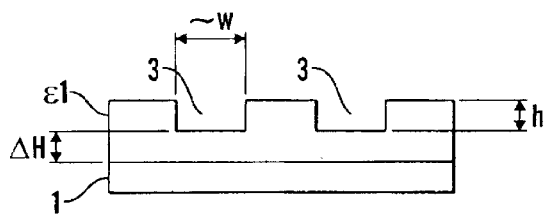
Figure 4:
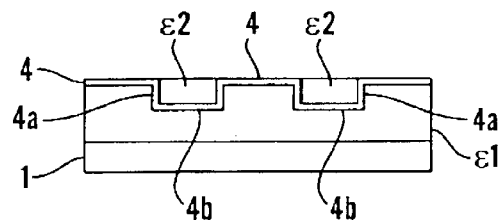
Figure 5:
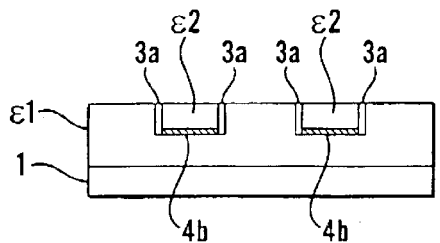
Figure 6:
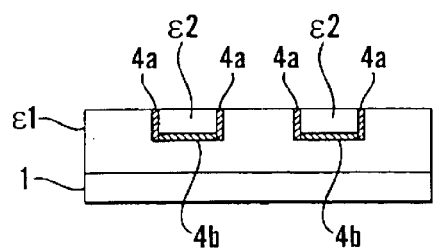
Figure 9:
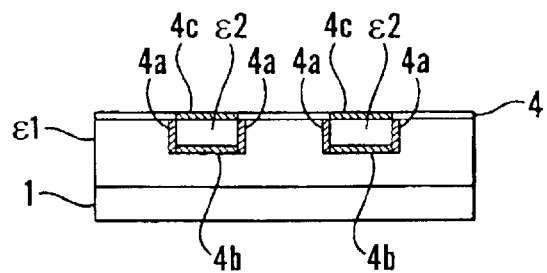
Figure 10:
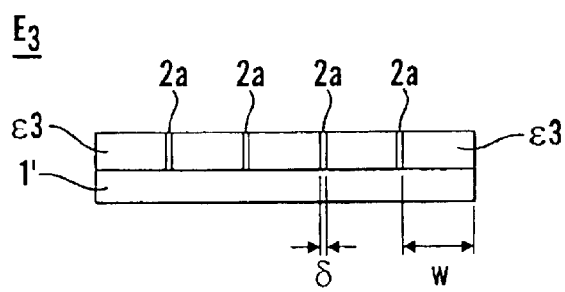
Figure 11A:
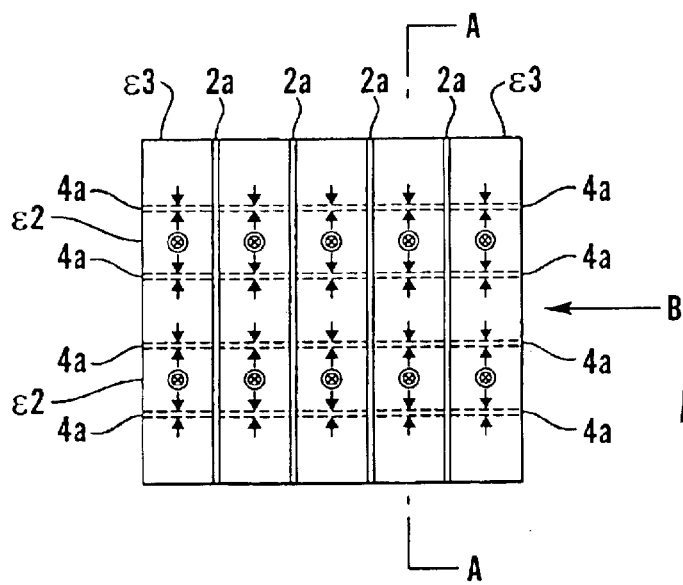
Figure 11B:
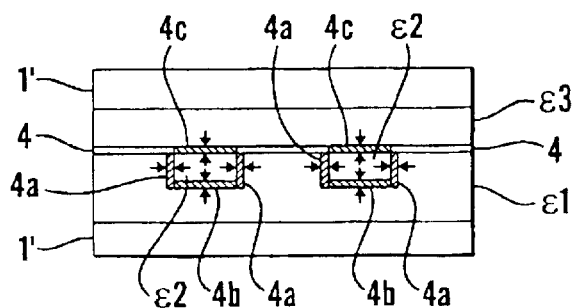

The invention will be better understood from the following description and particularly in connection with a discussion of the preferred embodiments read in conjunction with the appended drawing figures, of which FIG. 1 shows a cross section of a first electrode means as used in a memory device according to the invention, FIG. 2 a plan view of the electrode means in FIG. 1, FIG. 3 a cross section of a configuration of the first electrode means taken along the line A—A in FIG. 2, FIG. 4 a cross section of the first and second electrode means in a memory device as used in the apparatus according to the invention, FIG. 5 a cross section of the memory device as used in the apparatus according to the invention before a final stage in its fabrication, FIG. 6 a cross section of the memory device in FIG. 5 with memory cells in place, FIG. 7a a plan view of the memory device in FIG. 6 showing the arrangements of memory cells therein, FIG. 7b a cross section of the memory device in FIG. 7a, taken along the line a—a, FIG. 8a a plan view of a the memory cell in the memory device in FIGS. 7a and 7b, FIG. 8b a cross section of the memory cell in FIG. 8a, taken along the line C—C FIG. 9 a cross section of the memory device in FIG. 7a with a different embodiment of the memory cells, FIG. 10 a third electrode means in the memory device as used in the apparatus according to the invention, FIG. 11a a variant of the memory device as used in the apparatus according to the invention, FIG. 11b a cross section of the memory device in FIG. 11a, taken along the line A—A, FIG. 12a a preferred embodiment of the apparatus according to the invention in a stacked configuration, FIG. 12b a plan view of a memory cell therein, and FIG. 12c a cross section taken along the line C—C of the memory cell in FIG. 12b.

The apparatus according to the invention shall now be explained in detail with a thorough discussion of its component parts and embodiments thereof as shown in the drawing figures.

FIG. 1 shows a cross section of an electrode means in the apparatus according to the invention. The electrode means E1 comprises a number of parallel electrodes є1 which appears as strip-like in the plan view of the electrode means in FIG. 2. Each electrode є1 is located on an insulating substrate 1 and separated only by means of an insulating thin film 2a which prevents ohmic contact between the separate electrodes є1. The electrodes є1 is realized with a height H and a width w, but with a fairly high aspect ratio H/w. The insulating thin film 2a has a thickness δ which is typically smaller than the electrode width w and this implies that almost the whole area of an electrode means as its footprints appear in FIG. 2 is taken up by the electrodes, while the insulating thin-film layer or barrier 2a between the electrodes occupies only a small part thereof (if 0.15 μm or larger lithography is used; finer lithography reduces this difference). An electrode means of this kind can be fabricated by a method as disclosed in Norwegian patent application No. 20015509 filed Nov. 9, 2001, which belongs to the present inventor and hence the actual method for fabrication of a dense electrode means of this kind shall not be elucidated in further detail herein, as the above-mentioned application shall be regarded as included by reference. In that connection, however, it is to be remarked that the electrode width can conform to a minimum process-constrained feature f, the magnitude of which will be dependent on e.g. the design rules as applicable in for instance a photomicrolithographic patterning process. Anyway this implies that either the electrode width w or a distance d from one electrode to the next in the electrode means є1 shall be subject to a design rule of this kind, while this need not be the case of the thickness of the insulating thin film which can be deposited by processes unconstrained by any conventional design rule. It also follows that the actual width of e.g. every second electrode є1 in the electrode means E1 then can be smaller than the minimum process-constrained feature f by an amount 2δ, i.e. it will be the distance d=w+2δ that actually is constrained by the design rule.

Concerning the plan view in FIG. 2 it shows the electrode means with recesses 3 formed downwards from the top surfaces of the electrodes є1 thereof. These recesses which can have approximately the same width w as the electrodes є1, runs perpendicularly in the electrodes є1 and are separated by remaining portions of the electrodes є1 which similarly may have a width of approximately w. The recesses 3 extend from the top surface of the electrodes є1 and downward towards the substrate by an amount h and have a substantially rectangular cross section. At the bottom of the recesses the electrodes є1 will be bridged by a section thereof extended to a height δh over the substrate 1. It is to be understood that while δh+h=H, the magnitude of h may be chosen as about 50% of H. This is seen to advantage in FIG. 3 which shows a cross section of the electrode means E1 in FIG. 2 taken along the line A—A, in other words, viewed from the direction of B. Now the electrodes є1 with the recesses 3 are covered by an insulating thin film 4 and a second electrode means E2 comprising electrodes є2 are formed by deposited electrode material in the recesses 3, as shown in cross section of the electrode means E1 depicted in FIG. 4. The insulating thin film 4 can be any dielectric thin-film material, but preferably it could be a ferroelectric or electret thin-film material, of which more later. After the electrodes є2 of the second electrode means E2 have been deposited in the recesses 3, the insulating thin film 4 is etched away everywhere where not covered by the deposited electrodes є2, and this leaves a structure as shown in FIG. 5. Empty grooves 3a are now formed in the remaining portions of the recesses 3 between the electrodes є1;є2 and with the portion 4b of the insulating thin film 4 at the bottom of the recesses 3. The sidewalls of the recesses 3 in the electrodes є1 are now exposed. The grooves 3a are then filled with a memory material, e.g. a ferroelectric or electret polymer material 4a, which shall extend along the grooves between electrodes є1 and є2 as shown in FIG. 6. If the insulating thin film 4 originally was a ferroelectric or electret material, also the portion 4b shown at the bottom of the recesses 3 below the electrodes є2 will now be a memory material similar to that shown as 4a in FIG. 6.

FIG. 7a shows a plan view of the finished structure shown in FIG. 6. In FIG. 7a B indicates the viewing direction of the cross section shown in FIG. 6. It will now be seen that the electrodes є2 in the second electrode means E2 are oriented perpendicularly to the electrodes є1 of the first electrode means E1. The memory material 4a provided between the electrodes є1 and є2 at the grooves therebetween in the recesses 3 now form the memory medium in memory cells 5 created in the memory material 4a and optionally 4b at the crossing of an electrode є2 of the second electrode means E2 with an electrode є1 of the first electrode means E1 and hence the structure in FIG. 7a with memory material and electrodes є1, є2 now provides a passive matrix memory-addressable array of memory cells 5 which particularly shall be ferroelectric or electret memory cells and even more preferably such as realized with the memory material in the form of a polymer or a copolymer. FIG. 7b shows a section through FIG. 7a taken along the line A—A and it is now seen how by applying voltage over electrodes є1 and є2, thus establishing an electric potential therebetween and over the memory material 4a, optionally also 4b, the memory cells 5 can be either polarized or switched in different directions. The portion of the memory cell at 4a can e.g. be switched in a lateral direction relative to the extension of the memory device while the optional portion of the memory material 4b at the bottom of the recess 3 can be switched in a direction perpendicular to the plane of the memory device or, as implied by FIG. 7b, in the vertical direction. By doing so, three "subcells" can be switched simultaneously, whereby a signal three times larger is obtained, while the area of the bottom subcell equals the electrode overlap area and the area of the two side wall cells equals 2wh. The latter case thus introduces an extra dimension as compared with vertically switched cells as known in the art, which implies that cell footprints will be independent of an applied design rule.

FIGS. 8a and 8b show a memory cell in a memory device in the apparatus according to the invention in closer detail, with the switching directions indicated as applicable and conforming to the legend given in connection with FIGS. 8a and 8b. FIG. 8a shows a plan view of single memory cell with the electrodes removed and it will be seen that all the memory material in the sidewalls can be switched in the lateral direction, while the memory material in the bottom can be switched in as "vertical" direction. This is also shown to advantage in FIG. 8b, which shows a cross section of the memory cell 5 in FIG. 8a taken along the line C—C and with the outline of the electrodes є1,є2 indicated by stitched lines. This layout of a memory cell 5 differs appreciably from conventional memory cells in passive matrix-addressable memory devices, wherein the memory cell is provided in sandwich between overlying and underlying electrode means with the respective electrodes oriented mutually orthogonally for defining and addressing a memory cell in e.g. the global layer of the memory material sandwiched between the electrode layers. A conventional sandwich configuration of this kind allows a single switching direction, whereas the memory cell in the apparatus according to the invention shall allow at least three switching directions and this shall in its turn have a significant advantage for creating more reliable and more densely-packed passive matrix-addressable memory devices with ferroelectric or electret memory material, including an improved signal/noise ratio. An inspection of FIG. 7a shows that the memory device as depicted therein can be switched in three directions at a total of thirty locations for ten definable memory cells.

A fourth switching direction may now be obtained by providing a third electrode means E3 in the memory device in the apparatus according to the invention. FIG. 4 shows how the top surfaces of the electrodes $\epsilon1$, $\epsilon2$ of respective electrode means E1, E2 are provided with an insulating thin film 4, which e.g. can be formed by a ferroelectric or electret memory material, e.g. a polymer or copolymer material. At least on the top surfaces of the electrodes $\epsilon2$ the insulating thin film shall be a memory material, e.g. of the latter kind, and corresponding to the portions 4c as depicted in FIG. 9. Now a third electrode means E3 which actually is similar to the first electrode means E1 apart from the electrodes $\epsilon3$ of the former having smaller aspect ratio, is provided over the insulating thin film 4 with the electrodes $\epsilon3$ oriented in the same direction as the electrodes $\epsilon1$ of the electrode means E1, such that each electrode $\epsilon3$ of the former registers with the similar corresponding electrode $\epsilon1$ in the latter. The electrodes $\epsilon3$ in the electrode means E3 may for instance be provided on an insulating backplane 1' as shown in FIG. 10. Thus a memory device is obtained as somewhat schematically depicted in plan view in FIG. 11a which should be contemplated in conjunction with FIG. 11b, showing a cross section through the plan view in FIG. 11a taken along the line A—A and seen in the viewing direction from B. Each memory cell 5 defined in the usual manner and can as shown in FIG. 11b now be polarized or switched in four directions, as the portions 4c of memory material in a cell 5 now may be addressed via an electrode $\epsilon2$ of the second electrode means E2 and an orthogonally crossing electrode $\epsilon3$ of the third electrode means E3. Each memory cell can in other words be addressed in four directions at four separate locations thereof. Moreover a memory device corresponding to the one depicted in FIG. 11a and FIG. 11b will now be used in the apparatus according to the invention to implement the latter as a volumetric data storage apparatus simply by stacking the memory devices depicted in FIG. 11a and FIG. 11b on the top of each other. Each memory device in the stack, of course, will be separated by the insulating backplanes 1'.

However, a much more economical outcome or embodiment of the apparatus according to the invention as a volumetric data storage apparatus with stacked memory devices can be obtained with a configuration as shown in FIG. 12a. The basic building block is here the memory device as depicted e.g. in FIG. 9 and with insulating thin film 4 is provided on the top thereof. The thin film 4 can of course be a ferroelectric or an electret material and shall in any case in the portions over the top surface of the electrodes $\epsilon2$ be a memory material, e.g. a ferroelectric or electret material, preferably a polymer or copolymer material of this kind. Hence memory devices similar to the one shown in FIG. 9 are stacked on the top of each other forming a stack S1, S2, S3 of memory devices of this kind, and it will be seen that the electrodes $\epsilon1$ of an adjoining memory device now performs the function of the electrodes $\epsilon3$ in the memory device shown in FIG. 11b. In other words an apparatus according to the invention as shown in FIG. 12a with stacked memory devices will allow polarization and switching of the memory cells in four directions, viz. two lateral directions, and two vertical directions and at four separate locations in each memory cell. The apparatus shown in FIG. 12a can in other words be much simpler than an apparatus based on a memory device configured like the one shown in FIG. 11b.

FIG. 12b shows a plan view of a memory cell 5 in the apparatus in FIG. 12a with the electrodes removed and the switching directions indicated according to the accompanying legend. FIG. 12c shows a cross section of the memory cell 5 in FIG. 12b taken along the line C—C and clearly shows the switching directions as well as the box-like structure of a memory cell 5 in the apparatus according to the invention. Any memory cell in a memory device in the apparatus according to the invention as depicted in FIG. 12 shall of course be defined by the memory material surrounding the electrodes $\epsilon2$ at the crossing therebetween and respectively overlying and underlying electrodes $\epsilon1$ oriented orthogonally thereto.

It should also be noted that the ten memory cells obtainable in a memory device as depicted in FIG. 11a or FIG. 12a in either case allows no less than 40 addressing locations which can be compared with half the number of memory cells with the single addressing location for each obtainable in a conventional sandwich structure occupying the same real estate as for instance a single memory device in the apparatus as depicted in e.g. FIG. 11a or FIG. 12a. The area fill factor is also doubled, from 0.25 to 0.5 and with the added outcome of a doubled storage density and at least doubled capacitor area yielding a much improved signal/noise ratio and detectability. It should moreover be noted that the recesses containing the electrodes $\epsilon2$ and the memory material can be made much wider than, say a minimum process-constrained feature f, while the width w of the electrodes $\epsilon2a$ may be considerably less. However, then memory material 4a may be deposited with a correspondingly larger thickness and the same of course, also applies to the memory cell portions 4b or 4c. The thickness of the memory material therein is of course not limited by any specific design rule as it can be applied by various methods well-known to persons skilled in the art and with a thickness as described ranging from a few nm and upwards.

It should be noted that the apparatus according to the invention is not restricted to the exemplary preferred embodiments disclosed herein above. Other variant embodiment can be devised within the scope of the invention.

The proposed concept introduces a novel cell architecture allowing the application of a field in the direction lateral to the (circuitry) substrate (if hybrid design). This can be combined with vertical field applications, potentially at the same time. Multi-layer memories can be built with just one polymer layer/deposition, optionally applied as a last process step (no metal or other material deposited on the polymer), thus avoiding the described problems related to successive processing on polymer.

A memory matrix based on lateral switching can be made in a number of ways. A preferred embodiment is the following procedure: A thin insulating layer is deposited on the silicon wafer (e.g. $SiO_2$ or polymer ferroelectric material such as polyvinylidene difluoride (PVDF) or the copolymer polyvinylidene trifluoroethylene PVDF-TrFE). Then a first set of (parallel) electrodes is built on this layer (first mask step), having e.g. twice the thickness (height) or height/width relation of a typical electrode otherwise used for a crosspoint matrix memory of corresponding size and functionality. An insulating layer is then applied globally. Then the spacing between the electrodes is filled in with electrode material (same or different, possibly several different) to constitute a second set of electrodes. The resulting electrode pattern is referred to as "dense electrode pattern", as disclosed in the above-mentioned Norwegian patent application. These two electrode sets are henceforth called "bottom electrodes". Then a third set of parallel (top) electrodes, e.g. oriented 90° to the first two, is built by first making openings extending sufficiently through the bottom electrodes (e.g. 50%) using a (second) mask. Then a global insulator material is deposited, e.g. different from the one used for the bottom electrodes, e.g. in form of ferroelectric copolymer (necessary if vertical switching is to be used), followed by filling in the top electrode openings with same or an alternative electrode material. Then chemomechanical polishing (CMP) or another planarization process, e.g. global etching, is used to get rid of recess electrode/insulator material, such that the insulator material between all three electrode sets is exposed and thus a complete insulation is achieved between each of the electrode sets, the result being a crosspoint matrix array where the bottom electrodes are planar to the top electrode. The insulator material is then etched away down to the bottom level of the top electrode, and filled in with the memory material (e.g. a ferroelectric copolymer), either through traditional spin coating or an alternative technique, e.g. dip-coating from melt.

The latter etching and fill-in steps can be avoided if the insulator material is a ferroelectric material all the way or only in case of the top insulator material. The benefit of this is that there are no problems with polymer material filling of the narrow openings between electrodes; the drawback being that polymer material will be exposed to processing. The ability of polymer material to penetrate the narrow openings between electrodes may be facilitated by using electrostatic or similar attractor techniques, and also, because the bottom of the openings will always be an insulator material, the PVDF-TrFE film does not have to penetrate to the bottom of the openings.

By applying voltage to one of the bottom electrodes and the top electrode, polymer material on both sides of the top electrode at the corresponding bottom electrode crossing will be switched laterally. The thickness of the polymer material in this case corresponds to the thickness of polymer film in the vertical switching architecture. This means that the level of the applied voltage required to achieve full polarization switching is a direct function of the thickness of the polymer material in between electrode openings, and thus controlled through the thickness of the applied insulator material, not by the thickness of a spinned polymer layer. This ensures much better uniform thickness than if the polymer was applied in a vertical structure, and also that uneven electrode sidewalls does not destroy this unevenness, since the opposite electrode wall will reflect the other side wall evenness.

The fact that both sides of the top electrode switch simultaneously, means that the effective cell area is doubled and that the signal/noise ratio (SNR) thus is improved by a factor of 1.42. The effective cell area may be further enhanced by making the bottom and top electrodes thicker, since the cell area equals the cell length w times the cell height h. This fact accordingly allows an arbitrarily large cell area irrespective of the lateral cell footprint by introducing a vertical cell dimension. Cell height/thickness is not critical when using higher resolution lithography. All of this improves cell fatigue during switching accordingly.

The storage density of this first electrode structure corresponds to 2f2 or f2. If dense electrodes are used as the top electrodes, only two masks steps are involved. This compares well with the vertical architecture, which shall need two (or four) memory layers and 3 (or 6) mask steps to achieve the same.

When this first "layer" is built, additional layers may be added in various ways. One is simply depositing polymer film on top of the first structure, then building a new "bottom" electrode set on top of this. Thereby the top electrode in the first structure will combine with the bottom electrode in the next to produce an extra, 2f2 (or f2) memory layer (albeit with just one cell area/cell). Since this only requires one mask step, the resulting stack, representing a full f2 (or ½ f2) density, only involves 3 mask steps, while with the vertical architecture the same density would require (all mask step counts excluding vias masks) 6 (or 12) mask steps (2 double or 4 double layers). By adding a top electrode to the second structure, ⅔ f2 density is obtained, a new "bottom" electrode renders ⅓ f2, etc.

If restricted to the first electrode structure/layer, and etching away of insulator material, then fill-in with polymer film, no processing on the polymer will take place, meaning that a 2f2 (or f2) structure can be built without deteriorating the polymer with any post-deposition, something which is considered to be very advantageous for maintaining a morphology optimal for memory applications.

Since there is a planarization step between each electrode layer, there will be no loss of lithographic density/film uniformity by adding successive layers, also meaning that apart from potential complications with regard to vias or connections, there are technically no limits as to how many layers can be stacked in this manner, different from vertical architecture where planarization becomes increasingly difficult to achieve with successive layers.

An alternative approach to build laterally switchable cells is the following. First the parallel bottom electrodes are built, each electrode fitted with a "finger"-like extensions, one lithography step apart and extending from the electrode. Onto these electrodes another set of electrodes are built, at the same plane (on the same substrate level), by allowing these top electrodes to "climb" over the bottom electrodes at each crossing. The cell is defined as the area where the finger-like extensions overlap with the top electrodes, thus the distance between them deciding the "film thickness", that is, the lateral distance between the finger-like extension and the top electrodes representing the coercive field required. In order to make this sufficiently short (preferably less than 0.06 $\mu$m), which is difficult to achieve with lithography, several approaches can be used, one being to "misalign" the top electrodes relative to the bottom electrodes, say with less than 0.06 $\mu$m, the misalignement/displacement then constituting the "film thickness" in a vertical cell structure. Alternatively the dense electrode/barrier layer approach may be used.

Variations on the above can be used to achieve a higher area density for the cells, one being to position the finger-like extensions farther apart, e.g. two lithography steps apart, thus allowing switching on both sides of the finger, since now there will be two separate top electrodes surrounding each side of the extensions. It is also possible to use the dense electrode pattern concept to build denser top electrodes to achieve an increased cell density.

What is claimed is:

1. A matrix-addressable apparatus comprising one or more memory devices with multi-directionally switchable memory cells (5) arranged in a passive matrix-addressable array, wherein the memory cells (5) comprises a memory medium in the form of a ferroelectric or electret thin-film memory material capable of being polarized by an applied electric field and exhibiting hysteresis, wherein at least one memory device comprises at least two and not more than three electrode means (E), wherein the first electrode means (E) of said at least one memory device being either the only memory device of the apparatus or the first of two or more memory devices therein, is provided on an insulating substrate (1), and wherein the apparatus is characterized in that the first electrode means (E1) comprises parallel strip-like electrodes ($\epsilon$1) of width w and height h spaced apart and mutually electrically insulated by a portion (2a) of insulating thin-film material provided between the electrodes ($\epsilon$1) and covering the side edges thereof in a layer of thickness $\delta$, said thickness $\delta$ being small fraction of the electrode width w, that the electrodes ($\epsilon$1) have a high aspect ratio h/w, that the first electrode means (E1) comprises a plurality of parallel recesses (3) in the top surface thereof and oriented perpendicularly to the longitudinal axis of the electrodes ($\epsilon$1) with a width about equal to the electrode width w and extending downwards from the top surface of the electrodes ($\epsilon$1) to a distance h about one half of the height H of the latter, said recesses (3) being mutually spaced apart by a distance approximately equal to the width w of the electrodes, that at least the side walls of said recesses (3) are covered by a thin film (4a) of the memory material and the bottom surface thereof with the insulating thin film (4b) which optionally also can be formed by the memory material, and that electrodes ($\epsilon$1) of the second electrode set (E2) are provided in the recesses (3) contacting and interfacing the thin-film memory material (4a, 4b) thereof, such that the memory material provided in the recesses (3) forms the memory cell (5) of the memory device, a single memory cell (5) in each case being defined in the volume of the memory material located between an electrode ($\epsilon$1) of the first electrode means and an electrode ($\epsilon$2) of the second electrode means at the crossing thereof, whereby a memory cell (5) can be polarized and switched into lateral directions perpendicular to the side walls of the recess (3) and in a third direction perpendicular to the bottom surface of the recess (3), provided said bottom surface also is covered by the memory material.

2. An apparatus according to claim 1, wherein the at least one memory device comprises a third electrode means (E3), characterized in that an insulating thin film (4) is provided over the top surfaces of the electrodes ($\epsilon$1;$\epsilon$2) of the first and second electrode means (E1;E2) respectively, said insulating thin film in at least a portion (4c) covering the top surfaces of the electrodes ($\epsilon$2) of the second electrode means (E2) being formed by the memory material, that the electrodes ($\epsilon$3) of the third electrode means (E3) are provided contacting and interfacing the insulating thin film (4) in an arrangement similar to that of the first electrode means (E1) and oriented in the same direction as this and perpendicularly to the electrodes ($\epsilon$2) of the second electrode means (E2), such that an electrode ($\epsilon$3) of the third electrode means (E3) registers with the corresponding electrode ($\epsilon$1) of the first electrode means (E1), whereby each memory cell (5) is defined by a thin film (4a,4b,4c) of a memory material covering an electrode ($\epsilon$2) of the second electrode means (E2) at the crossing of the latter between an electrode ($\epsilon$1;$\epsilon$3) of the first and third electrode means (E1;E3) respectively, such that a memory cell (5) can be polarized and switched in a fourth direction perpendicular to the top surface of an electrode ($\epsilon$2) of the second electrode means (E2).

3. An apparatus according to claim 2, wherein two or more memory devices are provided in a vertical stack, characterized in that the top surfaces of the electrodes ($\epsilon$3) of the third electrode means are covered by an insulating backplane (1), and that each memory device are provided stacked one above each other separated by the insulating backplanes (1), whereby the apparatus is implemented as a volumetric data storage apparatus.

4. An apparatus according to claim 1, wherein two or more memory devices are provided in a vertical stack, characterized in that the first electrode means (E1) and the second electrode means (E2) of a memory device each are provided in registering relationship with respectively the corresponding electrode means (E1;E2) in any other memory device in the stack, that each memory device in the stack are separated from any adjacent neighbouring memory device by insulating thin film (4) applied over the top surfaces of the electrodes ($\epsilon$1;$\epsilon$2), said insulating thin film (4) at least in the portions (4c) where electrodes ($\epsilon$2) of the second electrode means (E2) cross the electrodes ($\epsilon$1) of the first electrode means (E1) in the adjacent neighbouring memory device being formed by the memory material which in these portions (4c) can be polarized or switched in a fourth direction perpendicular to the top surface of the electrodes ($\epsilon$2) of the second electrode means (E2) by applying an electric field between these electrodes and crossing electrodes ($\epsilon$) of the first electrode means (E1) of an adjacent neighbouring memory device, and that a memory cell (5) is defined in the memory material surrounding an electrode ($\epsilon$2) of the second electrode means (E2) at the crossing between the latter and the electrodes ($\epsilon$1) of the first electrode means (E1) in respectively the actual memory device and an adjacent neighbouring memory device in the stack, whereby the apparatus is implemented as a volumetric data storage apparatus with the first electrode means (E1) from a second memory device in the stack onward functions as a third electrode means of the underlying neighbouring memory device.

5. An apparatus according to claim 1, characterized in that the insulating thin-film material (4) is a ferroelectric or electret material.

6. An apparatus according to claim 1, characterized in that the memory material is a polymer or copolymer material.

7. An apparatus according to claim 1, characterized in that the insulating thin-film material (4) and the memory material is the same material.

8. An apparatus according to claim 7, characterized in that the memory material is a polymer or copolymer material.

* * * * *